United States Patent
Feyrin et al.

(10) Patent No.: US 10,765,027 B2
(45) Date of Patent: Sep. 1, 2020

(54) ASSEMBLY FOR ATTACHING AND CONNECTING A COMPUTER DATA STORAGE DEVICE TO AN ON-BOARD COMPUTER AND ASSOCIATED METHOD FOR USE

(71) Applicant: THALES, Courbevoie (FR)

(72) Inventors: Georges Feyrin, Pessac (FR); Pascal Abomnes, Le Haillan (FR); Nicolas Dupuis, Pessac (FR); Nicolas Meyre, Le Haillan (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 15/521,092

(22) PCT Filed: Oct. 19, 2015

(86) PCT No.: PCT/EP2015/074166
§ 371 (c)(1),
(2) Date: Apr. 21, 2017

(87) PCT Pub. No.: WO2016/062670
PCT Pub. Date: Apr. 28, 2016

(65) Prior Publication Data
US 2017/0354052 A1    Dec. 7, 2017

(30) Foreign Application Priority Data
Oct. 21, 2014  (FR) ..................... 14 02361

(51) Int. Cl.
*H05K 7/14*    (2006.01)
*G06F 1/18*    (2006.01)
(Continued)

(52) U.S. Cl.
CPC ........... *H05K 7/1452* (2013.01); *G06F 1/187* (2013.01); *G06F 13/4068* (2013.01);
(Continued)

(58) Field of Classification Search
CPC ...... H05K 7/1452; H05K 7/14; H05K 7/1488; G06F 2213/0032; G06F 13/42
(Continued)

(56) References Cited

U.S. PATENT DOCUMENTS 5,568,357 A * 10/1996 Kochis ................... H05K 7/005
                                                                349/58
5,717,570 A *  2/1998 Kikinis .................. G06F 1/181
                                                              312/223.2
(Continued)

FOREIGN PATENT DOCUMENTS

WO          9713188 A1    4/1997

OTHER PUBLICATIONS

International Search Report for PCT/EP2015/074166 dated Nov. 30, 2015.

*Primary Examiner* — Mandeep S Buttar
(74) *Attorney, Agent, or Firm* — Thompson Coburn LLP; Thaddeus J. Blenke

(57) ABSTRACT

The present invention relates to an assembly (10) for attaching a data storage device (12) to an on-board computer including an encapsulation structure (17), and a receiving structure (18) for receiving the encapsulation structure (17) comprising a first connector complementary to a connector of the storage device and a second connector complementary to a connector of the onboard computer.

The encapsulation structure (17) and the storage device (12) mounted therein are movable relative to the receiving structure (18) between an inserted configuration in which the encapsulation structure (17) and the storage device (12) are inserted into the receiving structure (18) and the connector of the storage device (12) is connected to the first connector, (Continued)

and a removed configuration in which the encapsulation structure (17) and the storage device (12) are removed from the receiving structure (18).

15 Claims, 2 Drawing Sheets

(51) Int. Cl.
    *G11B 33/12*     (2006.01)
    *G06F 13/40*     (2006.01)
    *G06F 13/42*     (2006.01)

(52) U.S. Cl.
    CPC ........ *G06F 13/4282* (2013.01); *G11B 33/122* (2013.01); *G11B 33/124* (2013.01); *H05K 7/1412* (2013.01); *H05K 7/1488* (2013.01); *G06F 2213/0032* (2013.01)

(58) Field of Classification Search
    USPC .................................................... 361/679.32
    See application file for complete search history.

(56) References Cited

U.S. PATENT DOCUMENTS

| | | | | |
|---|---|---|---|---|
| 5,886,869 A * | 3/1999 | Fussell | .................... | G06F 1/184 360/900 |
| 5,947,572 A * | 9/1999 | Chang | .................. | G11B 33/124 312/332.1 |
| 6,061,232 A * | 5/2000 | Ho | .......................... | G06F 1/184 361/679.31 |
| 6,304,440 B1 * | 10/2001 | Lin | ....................... | G11B 33/08 248/581 |
| 7,190,575 B1 | 3/2007 | Balk et al. | | |
| 8,556,869 B2 * | 10/2013 | Simon | ..................... | A61M 5/14 604/248 |
| 2003/0174464 A1 * | 9/2003 | Funawatari | .......... | G11B 25/043 361/679.36 |
| 2004/0032711 A1 * | 2/2004 | Kaczeus, Sr. | .......... | G11B 33/08 361/679.33 |
| 2004/0057202 A1 * | 3/2004 | Rabinovitz | ............. | G06F 1/184 361/679.02 |
| 2006/0050477 A1 * | 3/2006 | Wu | ....................... | G06F 1/1632 361/679.32 |
| 2008/0174731 A1 * | 7/2008 | Kang | ................ | G02F 1/133615 349/150 |
| 2010/0008053 A1 * | 1/2010 | Osternack | ........... | H05K 7/1412 361/752 |
| 2010/0259849 A1 | 10/2010 | Lee | | |
| 2013/0264590 A1 * | 10/2013 | Oh | ......................... | H01L 33/48 257/88 |
| 2013/0322007 A1 * | 12/2013 | Yang | .................... | G11B 33/126 361/679.31 |

* cited by examiner

ASSEMBLY FOR ATTACHING AND CONNECTING A COMPUTER DATA STORAGE DEVICE TO AN ON-BOARD COMPUTER AND ASSOCIATED METHOD FOR USE

CROSS-REFERENCE TO RELATED APPLICATIONS

This application is a U.S. National Phase application of PCT/EP2015/074166, filed on Oct. 19, 2015, claiming the benefit of FR Application No. 14 02361, filed Oct. 21, 2014, both of which are incorporated herein by reference in their entireties.

FIELD OF THE INVENTION

The present invention relates to an assembly for attaching and connecting a computer data storage device to an on-board computer.

On-board computers are often called upon to work in harsh environments with a certain number of constraints, in particular mechanical constraints. This is in particular the case for on-board computers in aircraft.

BACKGROUND OF THE INVENTION

In general, these computers are suitable for undergoing vibrations, high load factors or other types of constraints. These constraints are also imposed on all peripherals usable with these computers, for example computer data storage devices.

In the aeronautics field, it is known to use storage devices specially designed to withstand the mechanical constraints imposed by a harsh operating environment.

These storage devices are for example memory cards that do not have a movable mechanical part. The absence of a movable mechanical part allows these storage devices to better withstand mechanical constraints. These memory cards are read via appropriate reading devices.

However, these storage and reading devices are specific and are not commonly accessible components, generally referred to as commercial off-the-shelf (COTS). In particular, this makes it difficult to use storage devices with computers on the ground that are not equipped with appropriate reading devices.

There is also another type of storage device usable in the aeronautics field and having hard disks able to operate in harsh environments, which are provided with appropriate mechanical protection. This protection makes it possible to damp the vibrations of the storage devices and keep a constant connection with the on-board computer. This then makes it possible to use storage devices of the COTS type in harsh environments.

However, these storage devices provided with protection often assume the form of cumbersome computer components offset from the on-board computer, and generally do not allow quick removal of the storage device to use it with other computers, in particular computers on the ground.

SUMMARY OF THE INVENTION

One of the aims of the invention is to propose an attaching and connecting assembly supporting the use of storage devices of the COTS type in harsh environments while remaining compact and easy to use.

To that end, the present invention relates to an assembly for attaching and connecting a computer data storage device to an on-board computer, the storage device and the on-board computer each including a connector, the attaching assembly including:

an encapsulation structure defining a space for receiving the storage device and comprising means for attaching the storage device in this receiving space; and a receiving structure defining a receiving space making it possible to insert the encapsulation structure therein and comprising a first connector complementary to the connector of the storage device and a second connector complementary to the connector of the onboard computer;

wherein the encapsulation structure and the storage device mounted therein are movable relative to the receiving structure between an inserted configuration in which the encapsulation structure and the storage device are inserted into the receiving structure and the connector of the storage device is connected to the first connector, and a removed configuration in which the encapsulation structure and the storage device are removed from the receiving structure and the connector of the storage device is disconnected from the first connector.

According to other advantageous aspects of the invention, the attaching and connecting assembly comprises one or more of the following features, considered alone or according to all technically possible combinations:

the receiving structure includes a flexible link connecting the first connector and the second connector, one of the connectors being movable relative to the other;

the encapsulation structure comprises two parallel side walls defining the receiving space between them, each side wall including a guideway to guide the encapsulation structure during its insertion in or removal from the receiving structure;

the encapsulation structure further includes a proximal wall perpendicular to the side walls and accessible from the outside of the receiving structure when the encapsulation structure is inserted into the receiving structure;

the encapsulation structure comprises a locking device including at least one bolt and an actuating member able to be actuated from the proximal wall to take the encapsulation structure from a position locked in the receiving structure to an unlocked position;

the receiving structure comprises a locking stop for the or each bolt;

the receiving structure includes at least one pusher pushing the encapsulation structure in the direction of its removal from the receiving structure when the encapsulation structure is inserted into the receiving structure;

the receiving structure includes a side damping device making it possible to damp the movements of the encapsulation structure in a direction perpendicular to an insertion axis of the encapsulation structure into the receiving structure;

the encapsulation structure includes a mechanical mistake-proofing device making it possible to insert the encapsulation structure into the receiving structure uniquely;

the first connector is compatible with the SATA-type interface; and the second connector is compatible with the CompactPCI 3U-type interface.

The present invention also relates to a method for using such an attachment and connecting assembly including the following steps:

attaching the storage device in the encapsulation structure via the attaching means;

connecting the second connector of the receiving structure to the connector for connecting the on-board computer;

inserting the encapsulation structure with the storage device mounted, into the receiving structure; and removing the encapsulation structure with the storage device mounted, from the receiving structure.

BRIEF DESCRIPTION OF THE DRAWINGS

The features and advantages of the invention will appear upon reading the following description, provided solely as a non-limiting example, and done in reference to the appended drawings, in which.

DETAILED DESCRIPTION OF THE INVENTION

Figure 1:
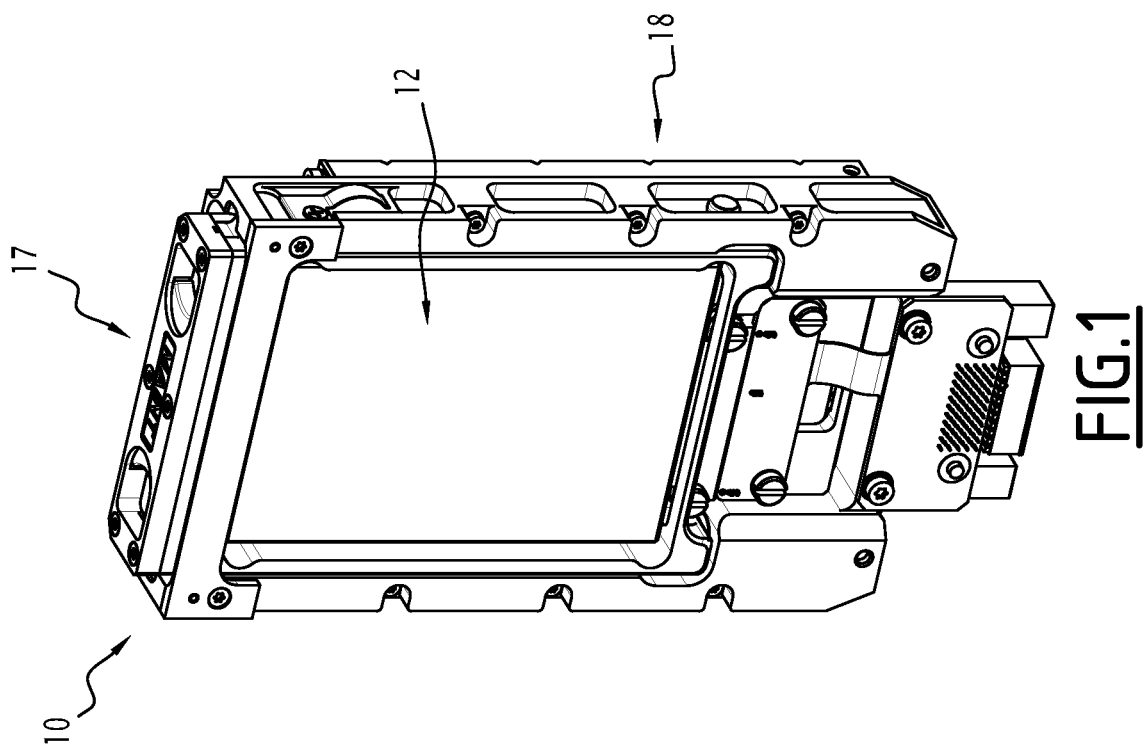
FIG. 1 is a perspective view of an attaching and connecting assembly according to the invention, the assembly including an encapsulation structure and a receiving structure, the encapsulation structure being inserted into the receiving structure.

An assembly 10 for attaching and connecting a computer data storage device 12 is shown in FIG. 1.

The storage device 12 is for example a hard disk of the SSD ("Solid-State Drive") type, known in itself. This device is also included in the category of commercial off-the-shelf (COTS) computer means.

The storage device 12 for example assumes the form of an elongated parallelepiped housing, 3.5" wide, with four side faces, one proximal face and one distal face. The distal and proximal faces are perpendicular to each of the side faces.

The storage device 12 comprises a connecting connector positioned on its distal face and for example compatible with the SATA electric interface with a connector of the NSS ("No Scratch SATA") type or any other type derived from this type.

The storage device 12 further comprises attaching means making it possible to attach it on an appropriate support. These attaching means for example comprise attaching holes positioned over the peripheral part of one of its side faces.

The assembly 10 makes it possible to connect and attach the storage device 12 to an on-board computer working in a harsh environment, for example the operating environment of an aircraft or any other airborne, land or spatial vehicle. This environment has a certain number of constraints, for example mechanical impacts and/or vibrations and/or significant load factors.

Figure 2:
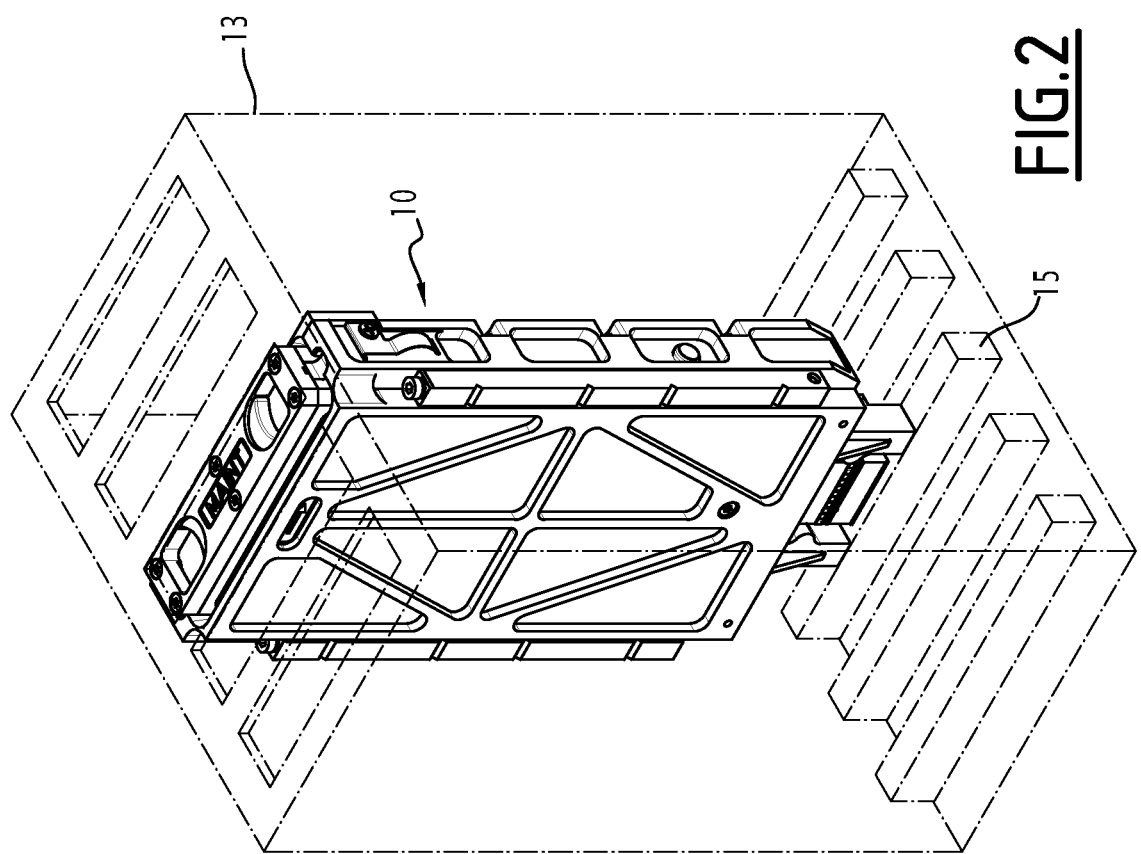
FIG. 2 is a perspective view of the assembly of FIG. 1 mounted in an on-board computer.

The on-board computer comprises a plurality of computer modules grouped together in a housing 13 illustrated in FIG. 2. This housing 13 further includes a back panel 14 attached on an attachment surface of this housing and comprising a plurality of connecting connectors making it possible to connect the different computer modules to one another.

More particularly, the back panel 14 includes at least one connecting connector compatible with the connecting surface of the CompactPCI 3U type. Such a connector is visible in FIG. 2, where it is designated by reference 15.

The housing 13 further includes an opening on a surface opposite the attaching surface facing each connector. This opening in particular makes it possible to remove or insert various computer modules from or in the housing 13.

In reference to FIG. 1, the attaching and connecting assembly 10 includes an encapsulation structure 17 able to receive the storage device 12 removably and a receiving structure 18 able to receive the encapsulation structure 17 removably and to be attached in the housing 13 of the on-board computer to connect the storage device 12 to the on-board computer.

Thus, the encapsulation structure 17 and the storage device 12 mounted therein are movable in the receiving structure 18 between an inserted configuration in which the storage device 12 is connected to the connecting connector 15 of the back panel 14, and a removed configuration in which the encapsulation structure 17 and the storage device 12 are removed from the receiving structure 18, and in particular from the housing 13.

In FIGS. 1 and 2, the encapsulation structure 17 is inserted into the receiving structure 18.

Figure 4:
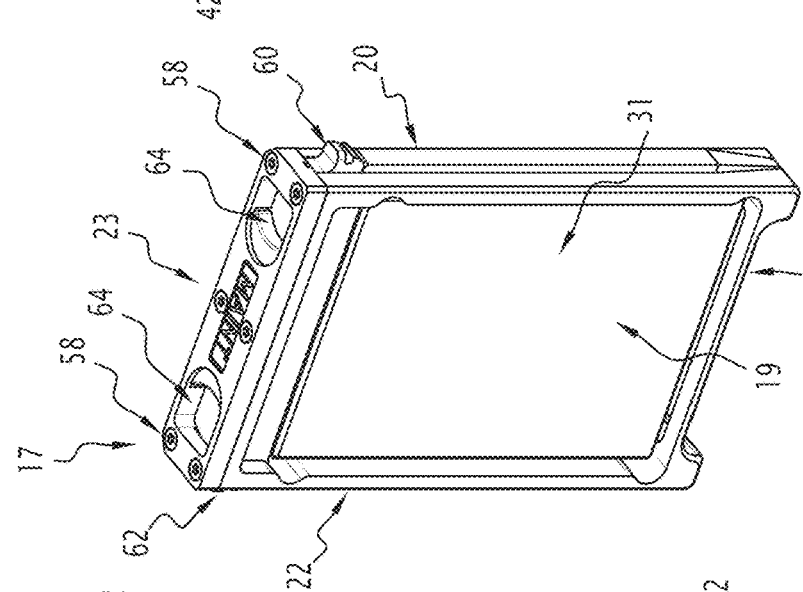
FIG. 4 is a perspective view of the encapsulation structure of FIG. 1 from another viewing angle.
Figure 3:
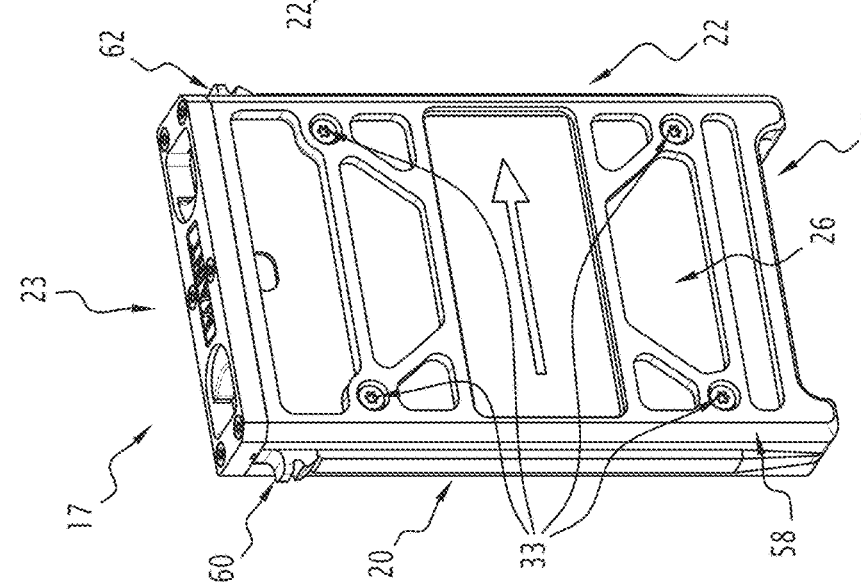
FIG. 3 is a perspective view of the encapsulation structure of FIG. 1.

The encapsulation structure 17 is illustrated in more detail in FIGS. 3 and 4, in which it is removed from the receiving structure 18.

In reference to these figures, the encapsulation structure 17 forms a peripheral frame for example made from a metal material and defining a receiving space 19. The peripheral frame is formed by two side walls 20 and 22, a proximal wall 23, a distal wall 25 and a back wall 26 closing the frame. The proximal and distal walls are perpendicular to the two side walls 20 and 22 and the back wall 26.

The peripheral frame thus has a parallelepiped shape with dimensions larger than those of the storage device 12 and defines an insertion window 31 for inserting the storage device 12 opposite the back wall 26.

The insertion window 31 is visible in FIG. 4 and makes it possible to insert the storage device 12 such that the side face of the storage device 12 including the attaching holes is pressed on the back wall 26 of the encapsulation structure 17, and the distal face of the storage device 12 comes into contact with the distal wall 25 of the encapsulation structure 17.

The back wall 26 of the encapsulation structure 17 includes means 33 for attaching the storage device 12 in the encapsulation structure 17, able to cooperate with the means for attaching the storage device 12.

In FIG. 3, these attaching means 33 assume the form of passage orifices positioned facing the attaching holes of the storage device 12 and screws with an appropriate size to be screwed into the attaching holes through the passage orifices.

Furthermore, the distal wall 25 of the encapsulation structure 17 defines a passage orifice for the NSS-type connecting connector of the storage device 12.

Figure 5:
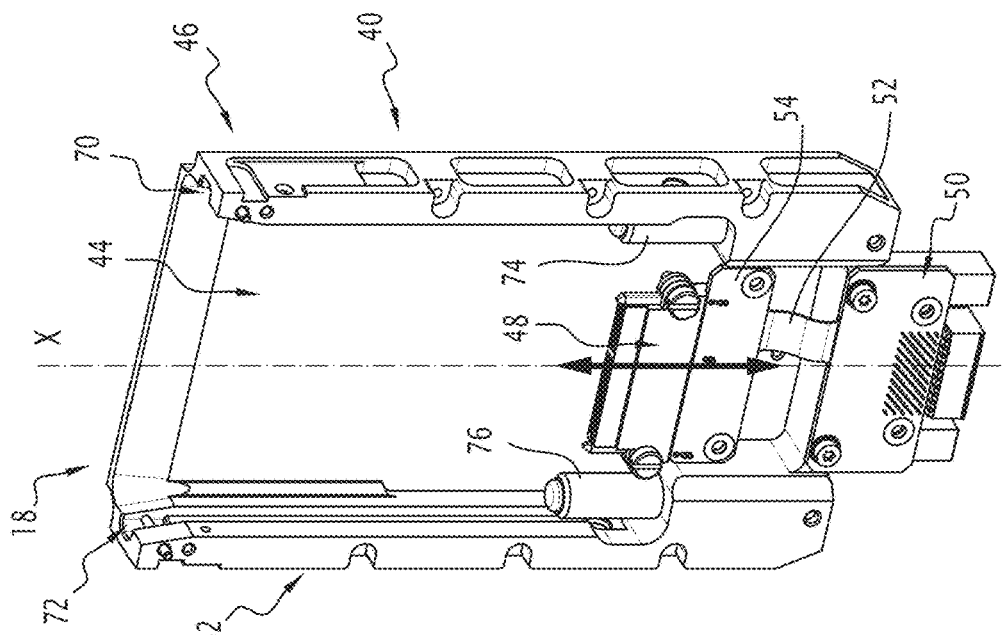
FIG. 5 is a perspective view of the receiving structure of FIG. 1.

The receiving structure 18 is illustrated in more detail in FIG. 5. In this figure, the encapsulation structure 17 is removed from the receiving structure 18.

Similarly to the encapsulation structure 17, the receiving structure 18 includes two side walls 40 and 42, parallel to one another and extending along an insertion axis X. These side walls 40 and 42 define a space 44 between them for receiving the encapsulation structure 17.

The receiving structure 18 further includes a back wall 46 extending transversely between the two side walls 40 and 42.

The receiving structure 18 has an elongated shape along the insertion axis X between a distal end able to come into contact with the back panel 14 and a proximal end opposite the distal end.

The receiving structure 18 forms a standard computer module of the on-board computer that is able to be attached in the housing 13 via the corresponding opening and using the attaching means provided to that end.

The receiving space 44 defines a distal part adjacent to the distal end of the receiving structure and a proximal part opposite the distal part.

The receiving structure 18 further includes a spacer for example having a rigid crossbar between the two side walls 40 and 42 positioned in the proximal end of the receiving structure 18 on the side opposite that of the bottom wall 46.

The receiving structure 18 further includes a first connector 48 complementary to the connecting connector of the storage device 12 and a second connector 50 complementary to the connecting connector 15 of the back panel 14. The first connector 48 is in particular compatible with the SATA electric interface with a connector of the NSS type complementary to the connecting connector of the storage device 12. The second connector 50 is in particular compatible with the connecting surface of the CompactPCI 3U type and complementary to the connecting connector of the back panel 14. Of course, other interfaces and/or connecting connectors can be considered.

The two connectors 48 and 50 are axially movable relative to one another and connected to one another by a flexible communication link 52. This link makes it possible to connect the connector of the storage device 12 to the connector 15 of the back panel 14.

The second connector 50 is positioned in the distal end of the receiving structure 18 and protrudes relative to the receiving structure 18 to cooperate with the connector 15 of the back panel. Furthermore, the second connector 50 is attached relative to the receiving structure 18.

The first connector 48 is mounted on a carriage 54 that is translatable relative to the receiving structure 18 along the insertion axis X. This first connector 48 is positioned in the distal part of the receiving space 44 to cooperate with the connector of the storage device 12 due to the insertion of the encapsulation structure 17 into the receiving space 44.

The encapsulation structure 17 is able to be inserted into the receiving space 44 along the insertion axis X via the proximal end of the receiving structure 18.

During this insertion, the side walls 20, 22 of the encapsulation structure 17 are intended to come into contact with the side walls 40, 42 of the receiving structure 18, respectively.

When the encapsulation structure 17 is inserted into the receiving structure, the proximal wall 23 of the encapsulation structure 17 protrudes relative to the receiving structure 18 and the housing 13.

The encapsulation structure 17 furthermore includes a mechanical mistake-proofing device 58 making it possible to insert the encapsulation structure 17 into the receiving structure 18 only in the manner described above.

This mistake-proofing device 58 for example assumes the form of two bevels situated on each side of the back wall 26 of the encapsulation structure 17.

Furthermore, the side walls 40 and 42 of the receiving structure 18 make it possible to guide the encapsulation structure 17 during its insertion or removal.

To that end, the side walls 20 and 22 of the encapsulation structure 17 each include a guideway protruding relative to the corresponding wall, and the side walls 40 and 42 of the receiving structure each define a shape substantially complementary to the corresponding guideway to receive this guideway.

The encapsulation structure 17 further includes a locking device making it possible to lock it in the receiving structure 18.

The locking device for example assumes the form of two bolts 60 and 62 respectively positioned on the side walls 20 and 22 of the encapsulation device 17 near the proximal wall 23. These bolts are visible in FIGS. 3 and 4.

Alternatively, the locking device assumes the form of a bolt positioned on one of the side walls 20 and 22 of the encapsulation device 17 near the proximal wall 23.

Of course, other forms of the locking device are also possible.

The bolts 60 and 62 can be actuated by a user from an actuating member 64 positioned on the proximal wall 23 of the encapsulation structure 17.

This member 64 makes it possible to take the bolts 60 and 62 from a locked idle position, in which they protrude relative to the side walls 20 and 22, to an unlocked position, in which they are received in the inner part of the proximal wall 23.

The receiving structure 18 includes two locking stops 70 and 72 respectively positioned on the side walls 40 and 42 of the receiving structure 18 to respectively cooperate with the bolts 60 and 62 when the encapsulation structure 17 is inserted into the receiving structure 18.

The actuating member 64 has an ergonomic shape suitable for allowing the user to actuate the unlocking with two fingers.

Furthermore, the actuating member 64 includes a return device allowing the bolts 60 and 62 to return from the unlocked position actuated by the user to the locked position when the user no longer exerts action on the member 64.

The receiving structure 18 further includes two pushers 74 and 76 positioned in the distal part of the receiving space 44. These pushers are visible in FIG. 5.

The pushers 74 and 76 make it possible to at least partially eject the encapsulation structure 17 from the receiving structure 18, and in particular outside the housing 13, thus facilitating gripping by the sides of the encapsulation structure 17.

More particularly, pushed by the pushers 74 and 76, part of the encapsulation structure 17 is able to be removed from the receiving structure 18. In the removed state, this part protrudes relative to the receiving structure 18, for example by 12 mm. This then allows the user to grasp the encapsulation structure 17 with his fingers by holding it by the parts removed from the side walls 20 and 22.

The pushers 74 and 76 for example have two springs bearing on the distal wall 25 of the encapsulation structure 17. When the encapsulation structure 17 is locked, the springs are stressed due to the insertion of the encapsulation structure 17 into the receiving structure 18. When the encapsulation structure 17 is unlocked, the springs are released and push the encapsulation structure 17 outside the receiving structure 18.

Lastly, the receiving structure 18 includes a side damping device (not shown) making it possible to damp the movements of the encapsulation structure in a direction perpendicular to the insertion axis X.

A method for using the attaching and connecting assembly according to the invention will now be described.

Initially, the attaching and connecting assembly 10 and the storage device 12 are provided. The encapsulation structure 17 is removed from the receiving surface 18.

A first step consists of attaching the storage device 12 in the encapsulation structure 17 by using the attaching means previously described. Thus, the encapsulation structure 17 and the storage space 18 mounted in the latter form a single component able to be transported or used with ground computers of the COTS type independently of the receiving structure 18.

A following step consists of attaching the receiving structure 18 in the housing 13 of the onboard computer in order to connect the second connector 50 to the connector 15 of the back panel 14.

A following step consists of inserting the encapsulation structure 17 and the storage device 12 mounted therein, into the receiving structure 18. To that end, the user pushes on the proximal wall 23 of the encapsulation structure 17 along the insertion axis X to overcome the pressure of the pushers 74, 76 and the carriage 54, and to pass the bolts 60 and 62 in the locking stops 70 and 72, respectively.

The encapsulation structure 17 is thus locked in the receiving structure 18 and the connector of the storage device 12 is connected to the first connector 48 of the receiving structure 18.

To remove the encapsulation structure 17, the user actuates the actuating member 64 to unlock the encapsulation structure 17 and the pushers 74 and 76 eject it from the receiving structure 18.

Thus, the attaching and connecting assembly is particularly simple to use.

The locking device and the pushers allow the user to insert and remove the encapsulation structure quickly and easily.

Furthermore, the first movable connector, the flexible link between the first connector and the second connector, the side damping device and the locking device allow the storage device to operate in harsh and restrictive environments, and provide good connectivity with the on-board computer.

The assembly according to the invention further makes it possible to use a storage device of the SSD type that is accessible to the general public and is able to work with most existing computers.

Lastly, the assembly according to the invention is particularly ergonomic and compact. It makes it possible to use the storage device as a simple computer module connected to the back panel of the onboard computer while leaving a possibility of removing it quickly and easily.

It should be noted that the locking device of the encapsulation structure includes a minimal number of parts. In particular, according to the described example embodiment, the locking device includes two bolts and an actuating member.

This in particular guarantees the robustness of the locking device.

The invention claimed is:

1. An assembly for attaching and connecting a computer data storage device to an on-board computer, the storage device and the on-board computer each including a connector, the attaching assembly including: an encapsulation structure defining a space for receiving the storage device and comprising means for attaching the storage device in this receiving space; and a receiving structure defining a receiving space making it possible to insert the encapsulation structure therein and comprising a first connector complementary to the connector of the storage device, the connector of the storage device being rigidly fixed relative to the storage device, and a second connector complementary to the connector of the onboard computer, a flexible communication link connecting the first connector and the second connector, one of the connectors being movable relative to the other, the flexible communication link being configured to isolate the storage device and the first connector from vibrations of the second connector; wherein the encapsulation structure and the storage device mounted therein are movable relative to the receiving structure between an inserted configuration in which the encapsulation structure and the storage device are inserted into the receiving structure and the connector of the storage device is connected to the first connector, the first connector positioned in a distal part of the receiving space of the receiving structure to cooperate with the connector of the storage device due to the insertion of the encapsulation structure into the receiving space, and a removed configuration in which the encapsulation structure and the storage device are removed from the receiving structure an the connector of the storage device is disconnected from the first connector, the first connector mounted on a carriage, the carriage being mobile relative to the receiving structure along an insertion axis defining a direction of movement of the storage device between the inserted configuration and the removed configuration.

2. The assembly according to claim 1, wherein the encapsulation structure comprises two parallel side walls defining the receiving space between them, each side wall including a guideway to guide the encapsulation structure during its insertion in or removal from the receiving structure.

3. The assembly according to claim 2, wherein the encapsulation structure further includes a proximal wall perpendicular to the side walls and accessible from the outside of the receiving structure when the encapsulation structure is inserted into the receiving structure.

4. The assembly according to claim 3, wherein:
the encapsulation structure comprises a locking device including at least one bolt and an actuating member able to be actuated from the proximal wall to take the encapsulation structure from a position locked in the receiving structure to an unlocked position; and
the receiving structure comprises a locking stop for the at least one bolt.

5. The assembly according to claim 4, wherein the actuating member has an ergonomic shape suitable for allowing a user to actuate the unlocking with two fingers.

6. The assembly according to claim 4, wherein the actuating member includes a return device allowing the at least one bolt to return from the unlocked position actuated by a user to the locked position when the user no longer exerts action on the member.

7. The assembly according to claim 1, wherein the receiving structure includes at least one pusher pushing the encapsulation structure in the direction of its removal from the receiving structure when the encapsulation structure is inserted into the receiving structure.

8. The assembly according to claim 7, wherein the at least one pusher makes it possible to at least partially eject the encapsulation structure from the receiving structure.

9. The assembly according to claim 1, wherein the receiving structure includes a side damping device making it possible to damp the movements of the encapsulation structure in a direction perpendicular to an insertion axis of the encapsulation structure into the receiving structure.

10. The assembly according to claim 1, wherein the encapsulation structure includes a mechanical mistake-proofing device making it possible to insert the encapsulation structure into the receiving structure in a single manner.

11. The assembly according to claim 1, wherein the first connector is compatible with the SATA-type interface.

12. The assembly according to claim 1, wherein the second connector is compatible with the CompactPCI 3U-type interface.

13. A method for using an attaching and connecting assembly according to claim 1, characterized in that it comprises the following steps:
   attaching the storage device in the encapsulation structure via the attaching means;
   connecting the second connector of the receiving structure to the connector for connecting the on-board computer;
   inserting the encapsulation structure with the storage device mounted, into the receiving structure; and
   removing the encapsulation structure with the storage device mounted, from the receiving structure.

14. The assembly according to claim 1, wherein the storage device presents a sensibly parallelepiped housing.

15. The assembly according to claim 1, wherein, in the inserted configuration, the first connector is rigidly fixed relative to the storage device.

* * * * *